United States Patent
Smith et al.

(10) Patent No.: US 11,411,173 B2
(45) Date of Patent: Aug. 9, 2022

(54) PERPENDICULAR SPIN TRANSFER TORQUE DEVICES WITH IMPROVED RETENTION AND THERMAL STABILITY

(71) Applicant: Intel Corporation, Santa Clara, CA (US)

(72) Inventors: Angeline Smith, Hillsboro, OR (US); Justin Brockman, Portland, OR (US); Tofizur Rahman, Portland, OR (US); Daniel Ouellette, Portland, OR (US); Andrew Smith, Hillsboro, OR (US); Juan Alzate Vinasco, Tigard, OR (US); James ODonnell, Forest Grove, OR (US); Christopher Wiegand, Portland, OR (US); Oleg Golonzka, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 909 days.

(21) Appl. No.: 16/009,776

(22) Filed: Jun. 15, 2018

(65) Prior Publication Data
US 2019/0386209 A1 Dec. 19, 2019

(51) Int. Cl.
*H01L 43/10* (2006.01)
*H01L 43/02* (2006.01)
*H01L 43/08* (2006.01)
*H01L 43/12* (2006.01)

(52) U.S. Cl.
CPC ............ *H01L 43/10* (2013.01); *H01L 43/02* (2013.01); *H01L 43/08* (2013.01); *H01L 43/12* (2013.01)

(58) Field of Classification Search
CPC ......... H01L 43/10; H01L 43/02; H01L 43/08; H01L 43/12
USPC ........................................................ 257/421
See application file for complete search history.

(56) References Cited

U.S. PATENT DOCUMENTS

| | | | |
|---|---|---|---|
| 8,018,011 B2 * | 9/2011 | Ranjan | G11C 11/1673 257/421 |
| 10,453,510 B2 | 10/2019 | Park et al. | |
| 2013/0336045 A1 * | 12/2013 | Kuo | H01L 43/08 365/158 |
| 2015/0076633 A1 | 3/2015 | Siddik et al. | |

(Continued)

FOREIGN PATENT DOCUMENTS

WO 2017135767 8/2017

OTHER PUBLICATIONS

Extended European Search Report from European Patent Application No. 19173097.7 notified Nov. 25, 2019, 7 pgs.

(Continued)

*Primary Examiner* — Tu-Tu V Ho
(74) *Attorney, Agent, or Firm* — Essential Patents Group, LLP

(57) ABSTRACT

Material stacks for perpendicular spin transfer torque memory (pSTTM) devices, pSTTM devices and computing platforms employing such material stacks, and methods for forming them are discussed. The material stacks include a cladding layer of predominantly tungsten on a protective layer, which is in turn on an oxide capping layer over a magnetic junction stack. The cladding layer reduces oxygen dissociation from the oxide capping layer for improved thermal stability and retention.

20 Claims, 9 Drawing Sheets

(56) References Cited

U.S. PATENT DOCUMENTS

2016/0155932 A1    6/2016  Chen et al.
2019/0165253 A1*  5/2019  Sun ........................ H01L 43/02

OTHER PUBLICATIONS

Notice of Allowance from European Patent Application No. 19173097.7 notified Nov. 11, 2021, 7 pgs.

* cited by examiner

PERPENDICULAR SPIN TRANSFER TORQUE DEVICES WITH IMPROVED RETENTION AND THERMAL STABILITY

BACKGROUND

Magnetic memory devices such as spin transfer torque memory (STTM) devices include a magnetic tunnel junction (MTJ) for switching and detecting the state of the memory. The MTJ includes fixed and free magnets separated by a barrier layer such that the fixed and free magnets have perpendicular magnetic anisotropy (PMA) (out of the plane of a substrate and/or MTJ layers). In the detection of the memory state, a magnetic tunnel junction resistance of the memory is established by the relative magnetization of the fixed and free magnets. When the magnetization directions are parallel, the magnetic tunnel junction resistance is in a low state and, when the magnetization directions are anti-parallel, the magnetic tunnel junction resistance is in a high state. The relative magnetization directions are provided or written to the memory by varying the magnetization direction of the free magnet while the magnetization direction of the fixed magnet remains, as the name implies, fixed. The magnetization direction of the free magnet is changed by passing a driving current polarized by the fixed magnet through the free magnet.

MTJ devices having PMA have the potential to attain high density memory. However, scaling such devices to higher densities is difficult with respect to thermal stability and retention of the devices. Greater thermal stability is advantageously associated with longer memory element non-volatile lifetimes. Greater retention is advantageously associated with fewer failures of the non-volatile memory retaining its state (parallel or anti-parallel). As scaling to smaller sizes continues, it becomes more difficult to maintain sufficient thermal stability and retention.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Furthermore, where considered appropriate, reference labels have been repeated among the figures to indicate corresponding or analogous elements. In the figures.

DETAILED DESCRIPTION

Figure 1:
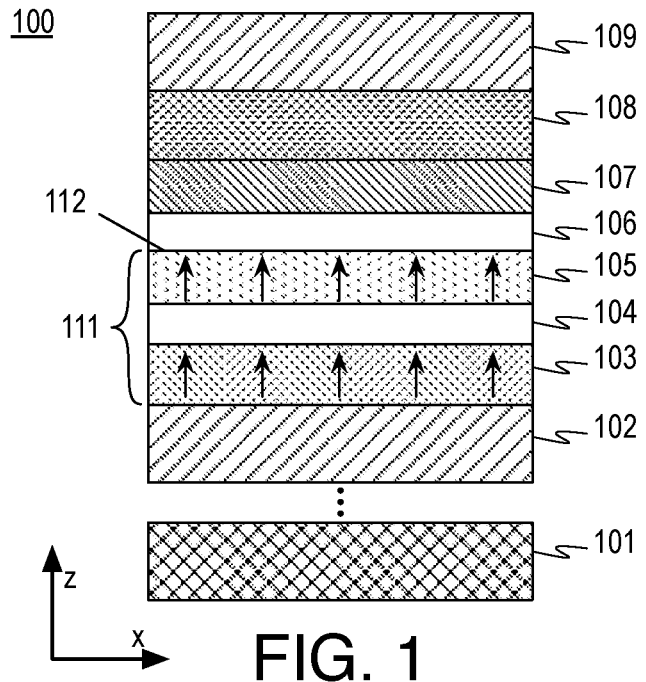
FIG. 1 illustrates a cross-sectional view of a material layer stack for a perpendicular STTM device.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Furthermore, the terms "substantially," "close," "approximately," "near," and "about," generally refer to being within +/−10% of a target value. The term layer as used herein may include a single material or multiple materials.

The term "free" or "unfixed" as used herein with reference to a magnet refers to a magnet whose magnetization direction can change along its easy axis upon application of an external field or force (e.g., Oersted field, spin torque, etc.). Conversely, the term "fixed" or "pinned" as used herein with reference to a magnet refers to a magnet whose magnetization direction is pinned or fixed along an axis and which may not change due to application of an external field (e.g., electrical field, Oersted field, spin torque, etc.). As used herein, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees+/−20 degrees relative to an x-y plane of a device. Furthermore, the term "device" generally refers to an apparatus according to the context of the usage of the term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device Magnetic tunnel junction apparatuses, devices, systems, computing platforms, material stacks, and methods are described below related to magnetic tunnel junction devices having an MTJ stack of free and fixed magnetic layers separated by a tunnel barrier layer and a cladding layer of predominantly tungsten over an oxide layer on the free magnet.

As described above, it may be advantageous to provide magnetic tunnel junction devices having increased thermal stability and retention or to maintain such characteristics at suitable levels for operation as devices are scaled. In some embodiments, a magnetic junction device includes a magnetic tunnel junction having a fixed magnet layer and a free magnet layer separated by a barrier layer such that the fixed and free magnet layers have perpendicular magnetic anisotropy (PMA). PMA is characterized by a magnetic easy axis that is substantially perpendicular to planes of the fixed and free magnet layers (and in-line with their thicknesses). Such PMA may be contrasted with in-plane magnetic anisotropy, which is parallel or in-plane with respect to the plane of the layer. The perpendicular magnetic anisotropy of the fixed and free magnet layers may be provided or established based on the thickness of the layers and/or the interfaces of the layers with their respective adjoining materials. Furthermore, the magnetic tunnel junction device includes an oxide layer on the free magnet layer for improved performance of the free magnet layer and a protective layer on the oxide layer. The protective layer includes iron and it protects the oxide layer during deposition of subsequent layers. The magnetic tunnel junction device also includes a cladding layer that is predominantly tungsten on the protective layer. As used herein, the term predominantly indicates the predominant constituent is the constituent of greatest proportion in the layer or material). In some embodiments, the cladding layer is pure or nearly pure tungsten (e.g., greater than 99% tungsten or more).

The tungsten cladding layer may replace previous tantalum materials for improved thermal stability and retention of the device. Tungsten may have a relatively low oxygen affinity (e.g., lower than that of tantalum) and may preserve oxygen in the previously discussed oxide layer. Such oxygen retention maintains iron-oxygen bonds at the interface of the free magnet layer and the oxide layer, which is magnesium oxide is some embodiments, to preserve PMA in the free magnet layer (e.g., the storage layer of the device), which would otherwise be depleted when the oxygen is lost. For example, the PMA of the free magnet layer is due to the material composition and structure of the free magnet layer, the thickness of the free magnet layer, and the interface of the free magnet layer with directly adjacent materials in the stack. By maintaining the oxygen at the interface of the free magnet layer with the oxide layer, PMA of the free magnet layer is improved as are important performance characteristics of the memory device such as thermal stability, retention, and others.

FIG. 1 illustrates a cross-sectional view of a material layer stack 100 for a perpendicular STTM device, arranged in accordance with at least some implementations of the present disclosure. For example, material layer stack 100 may be incorporated into an MTJ device. Material layer stack 100 may be characterized as a magnetic tunnel junction device structure. As shown, material layer stack 100 includes a terminal electrode 102 (e.g., a bottom electrode, BE) over a substrate 101. A fixed magnetic material layer 103 is on or over terminal electrode 102. Fixed magnetic material layer 103 may include a single fixed magnetic material or a stack of fixed magnetic materials. As shown, tunnel barrier layer 104 is on or over fixed magnetic material layer 103 (and between fixed magnetic material layer 103 and free magnetic material layer 105). Free magnetic material layer 105 is on or over tunnel barrier layer 104. Free magnetic material layer 105 may include a single free magnetic material or a stack of free magnetic materials magnetically coupled through intervening metal coupling material layers. An oxide layer 106, which may be characterized as an oxide capping layer, is on free magnetic material layer 105. In some embodiments, free magnetic material layer 105 is one or a combination of MgO, VO, WO, TaO, HfO, or MoO. A protective layer 107 is on or over oxide layer 106 and protects oxide layer 106 during deposition of subsequent layers. A predominantly tungsten cladding layer 108 is over protective layer 107 and provides for reduced or no oxygen removal from oxide layer 106 for improved device performance as is discussed further herein. A terminal electrode 109 (e.g., a top electrode, TE) is on or over tungsten cladding layer 108. Notably, the order of material layers 102-109 may be inverted and/or material layers 102-109 may extend laterally from a topographic feature sidewall in some embodiments.

As shown, material layer stack 100 provides a perpendicular magnetic system such that the magnetic easy axes of the magnetic material layers 103, 105 are in the z-direction out of the plane of substrate 101. Fixed magnetic material layer 103 may be composed of any material or stack of materials suitable for maintaining a fixed magnetization direction while free magnetic material layer 105 may be composed of any material or stack of materials that is magnetically softer (e.g., magnetization may more easily rotate to parallel and antiparallel state) with respect to fixed magnetic material layer 103). Fixed magnetic material layer 103 may be characterized as a fixed magnet, a fixed magnet layer, or a fixed magnetic stack.

In some embodiments, material layer stack 100 is based on a CoFeB/MgO system including fixed magnetic material layer 103 composed of CoFeB, tunnel barrier layer 104 composed of MgO, and free magnetic material layer 105 composed of CoFeB. That is, in some embodiments, fixed magnetic material layer 103 include one or more of Co, Fe, and B, tunnel barrier layer 104 includes one or more of Mg and O, and free magnetic material layer 105 include one or more of Co, Fe, and B. In some embodiments, all CoFeB layers have body-centered cubic (BCC) (001) out-of-plane texture such that texture herein refers to the majority distribution of crystallographic orientations within the layers of MTJ structure 101. In some embodiments, the CoFeB magnetic material layers 103, 105 are iron-rich alloys for increased magnetic perpendicularity. For example, an iron-rich alloy is an alloy having more iron than cobalt. Other magnetic material systems may be used for fixed magnetic material layer 103 and/or free magnetic material layer 105 such as Co, Fe, Ni systems.

In some embodiments, free magnetic material layer 105 is CoFeB. In some embodiments, free magnetic material layer 105 has a thickness in the range of 1 to 2.5 nm. For example, a free magnetic material layer 105 having a thickness of less than 2.5 nm exhibits PMA. In some embodiments, free magnetic material layer 105 has a thickness in the range of 0.6 to 1.6 nm. Furthermore, interfacial PMA may be provided from iron-oxygen hybridization between free magnetic material layer 105 with tunnel barrier layer 104 and oxide layer 106. In some embodiments, fixed magnetic material layer 103 has a thickness in the range of 0.1 to 1 nm. In some embodiments, free magnetic material layer 105 has a thickness that is less than the thickness of fixed magnetic material layer 103. In an embodiment, fixed magnetic material layer 103 is composed of a single layer of CoFeB. In an embodiment, fixed magnetic material layer 103 has a thickness in the range of 2 to 3 nm. As discussed, fixed magnetic material layer 103 and free magnetic material layer 105 have PMA and material layer stack 100 is in a high resistance state when direction of magnetization in free magnetic material layer 105 is anti-parallel (opposite) to the direction of magnetization in fixed magnetic material layer 103 and is in a low resistance state when direction of magnetization in free magnetic material layer 105 is parallel to the direction of magnetization in fixed magnetic material layer 103 (as illustrated). Change in state are affected when a spin polarized electron current passing through fixed magnetic material layer 103, tunnel barrier layer 104, and free magnetic material layer 105 brings about a change in the direction of the magnetization in the free magnetic material layer 105. Free magnetic material layer 105 may be characterized as a free magnet, a free magnet layer, or a free magnetic stack.

Tunnel barrier layer 104 is composed of a material or stack of materials suitable for allowing current of a majority spin to pass through the layer, while impeding current of a minority spin (e.g., a spin filter). In some embodiments, tunnel barrier layer 104 is or includes magnesium oxide (MgO). In some embodiments, tunnel barrier layer 104 is or includes magnesium aluminum oxide (MgAlO). In some embodiments, tunnel barrier layer 104 is or includes aluminum oxide ($Al_2O_3$). Tunnel barrier layer 104 may provide a crystallization structure (e.g., BCC with (001) texture) for solid phase epitaxy of free magnetic material layer 105 and/or fixed magnetic material layer 103. Tunnel barrier layer 104 may be characterized as a barrier layer, a tunneling layer, or an oxide layer.

Material layer stack 100 further includes oxide layer 106 disposed over or on the free magnetic material layer 105 of magnetic tunnel junction 111. In an embodiment, oxide layer 106 is or includes an MgO such that oxide layer includes Mg and O. In some embodiments, oxide layer 106 is or includes one or more of VO, WO, TaO, HfO, or MoO. In some embodiments, oxide layer 106 has a thickness of not less than 2 nm. In an embodiment, oxide layer 106 has a thickness in the range of 1.5 to 4 nm. In an embodiment, oxide layer 106 has a thickness in the range of 0.3 to 1.5 nm. Notably, oxide layer 106 provides a source of oxygen for oxygen-iron hybridization at an interface 112 of free magnetic material layer 105 and oxide layer 106. Such oxygen-iron hybridization at interface 112 provides for interfacial perpendicular anisotropy in free magnetic material layer 105. As discussed, maintaining the interfacial perpendicular anisotropy improves the performance of material layer stack 100 with respect to thermal stability and retention at free magnetic material layer 105. In particular, by providing predominantly tungsten cladding layer 108, the oxygen at interface 112 is maintained with respect to other material choices for such a layer. For example, tantalum, having a high affinity for oxygen, near oxide layer 106 (even opposite protective layer 107 therefrom) may disadvantageously be a getter for oxygen making oxide layer 106 oxygen deficient at interface 112, which results in poor PMA at free magnetic material layer 105 and poor performance of material layer stack 100 with respect to at least thermal stability and retention.

With continued reference to FIG. 1, protective layer 107 is over or on oxide layer 106. Protective layer 107 provides a barrier for oxide layer 106 against, for example, direct physical sputter damage during deposition of subsequent layer(s) such as tungsten cladding layer 108. In some embodiments, protective layer 107 is an alloy having individual constituent atoms with lower atomic masses compared to the atomic mass of the material(s) of tungsten cladding layer 108 (e.g., each constituent atom of protective layer 107 has a lower atomic mass than that of tungsten). In some embodiments, protective layer 107 has a thickness in the range of 0.3 to 1.5 nm. In an embodiment, protective layer 107 is a CoFeB material. In an embodiment, protective layer 107 includes one or more of Co, Fe, and B. In an embodiment, protective layer 107 has a stoichiometry of cobalt and iron and a thickness to make the CoFeB non-magnetic. In an embodiment, protective layer 107 includes cobalt and iron and is notable in not including boron.

Furthermore, a thickness of protective layer 107 is provided to prevent damage during deposition of tungsten cladding layer 108 as discussed.

Tungsten cladding layer 108 is over or on protective layer 107. As discussed, tungsten cladding layer 108 is predominantly tungsten (i.e., the constituent having the greatest proportion in cladding layer 108 is tungsten). In some embodiments, tungsten cladding layer 108 is pure or nearly pure tungsten. In an embodiment, tungsten cladding layer 108 is not less than 95% tungsten by weight (e.g., the mass fraction of tungsten in tungsten cladding layer 108 is not less than 95%). In an embodiment, tungsten cladding layer 108 is not less than 99% tungsten by weight. In an embodiment, tungsten cladding layer 108 is not less than 99.9% tungsten by weight. In some embodiments, tungsten cladding layer 108 is notable in that it is absent of tantalum. In particular, tungsten cladding layer 108 may provide a tantalum free thickness on protective layer 107. Tungsten cladding layer 108 may be characterized as a tungsten protective layer, a tungsten cladding, etc.

Tungsten cladding layer 108 may have any suitable thickness. In an embodiment, tungsten cladding layer 108 has a thickness in the range of 0.5 to 5 nm (e.g., not less than 0.5 nm and not more than 5 nm). In an embodiment, tungsten cladding layer 108 has a thickness of about 4 nm (e.g., not less than 3.8 nm and not more than 4.2 nm). In an embodiment, tungsten cladding layer 108 has a thickness of about 3 nm (e.g., not less than 2.8 nm and not more than 3.2 nm). In an embodiment, tungsten cladding layer 108 has a thickness of about 2 nm (e.g., not less than 1.8 nm and not more than 2.2 nm). In an embodiment, tungsten cladding layer 108 has a thickness of not less than 2 nm and not more than 2.5 nm. In particular, the inventors have found that reduction of the thickness of tungsten cladding layer 108 from 4 nm to 3 nm to 2 nm provides improved retention (e.g., fewer failing bits) for most sizes of material layer stack 100 (e.g., sizes in the x and y dimensions such that the y dimension is into the page). For example, for a circular device having a diameter (e.g., in the x or y dimension, with y coming out of the page in FIG. 1) in the range of about 5 to 100 nm, tungsten cladding layer 108 having a thickness of not more than 2.5 nm is advantageous. The thicknesses of tungsten cladding layer 108 described above may not have much effect on the resistivity of material layer stack 100 while providing the benefits discussed herein. Furthermore, it may be advantageous, when using tantalum, to provide terminal electrode 109 with a dual layer structure such that a layer of ruthenium is on tungsten cladding layer 108 and a layer of tantalum is on the layer of ruthenium. Notably, the discussed layer of ruthenium is absent tantalum. In an embodiment, the layer of ruthenium has a thickness in the range of 2 to 8 nm with a thickness of about 5 nm being particularly advantageous and the layer of tantalum has a thickness is in the range of 3 to 10 nm with a thickness of about 6 nm being particularly advantageous.

Terminal electrodes 102, 109 may include any suitable conductive material(s). In an embodiment, terminal electrode 102 is composed of a material or stack of materials suitable for electrically contacting fixed magnetic material layer 103 of material layer stack 100. In some embodiment, the terminal electrode 102 is a topographically smooth electrode. In an embodiment, terminal electrode 102 is composed of ruthenium layers interleaved with tantalum layers. In an embodiment, terminal electrode 102 is titanium nitride. In an embodiment, terminal electrode 102 has a thickness in the range of 20 to 50 nm. In an embodiment, terminal electrode 109 includes one or more of ruthenium, tantalum, or titanium nitride. In an embodiment, terminal electrode 109 includes a material suitable to provide a hardmask for etching material layer stack 100 to form pSTTM devices. In an embodiment, terminal electrode 109 has a thickness in the range of 30 to 70 nm. In an embodiment, terminal electrodes 102, 109 are the same metal. Terminal electrodes 102, 109 may be characterized as electrodes, electrode layers, metal electrodes, etc.

In operation, a pSTTM device employing material layer stack 100, or any other material layer stack discussed herein, functions as a variable resistor where the resistance of the device switches, as discussed, between high (anti-parallel magnetization) and low (parallel magnetization) states with switching effectuated by passing a critical amount of spin polarized current to change the orientation of the magnetization of the free magnetic layer(s) to align with the magnetization of the fixed magnetic layer(s). By changing the direction of the current, the magnetization in the free magnetic layer may be reversed. Since the free magnetic layer does not need power to retain the relative orientation of magnetization, pSTTM is non-volatile memory.

Figure 2:
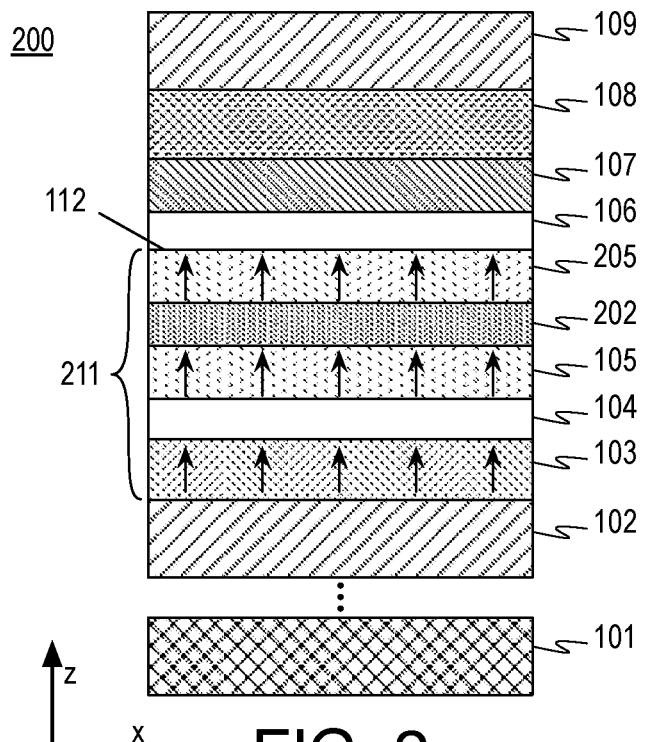
FIG. 2 illustrates a cross-sectional view of a material layer stack including an exemplary multi-layer free magnetic material layer for a perpendicular STTM device.

FIG. 2 illustrates a cross-sectional view of a material layer stack 200 including an exemplary multi-layer free magnetic material layer for a perpendicular STTM device, arranged in accordance with at least some implementations of the present disclosure. For example, material layer stack 200 may be incorporated into any MTJ device discussed herein. Herein, like materials and components are labeled with like reference numerals. Notably, with respect to material layer stack 100, material layer stack 200 includes at least a second free magnetic material layer 205 coupled to free magnetic material layer 105 by an intervening metal coupling layer 202. That is, metal coupling layer 202 is over or on free magnetic material layer 105 and second free magnetic material layer 205 is over or on metal coupling layer 202. Inclusion of metal coupling layer 202 and second free magnetic material layer 205 increases the number of material interfaces within magnetic tunnel junction 211 (relative to magnetic tunnel junction 111), which increases overall interfacial perpendicular anisotropy in the magnetic tunnel junction 211.

Second free magnetic material layer 205 may include any material(s) and characteristics discussed with respect to free magnetic material layer 105. In an embodiment, free magnetic material layer 105 and free magnetic material layer 205 both are or include CoFeB. In an embodiment, free magnetic material layer 105 and free magnetic material layer 205 are CoFeB and free magnetic material layer 105 has a thickness greater than the thickness of second free magnetic material layer 205. In an embodiment, a CoFeB free magnetic material layer 105 has a thickness in the range of 0.5 to 2 nm and a CoFeB second free magnetic material layer 205 has a thickness in the range of 0.3 to 1.5 nm. In some embodiments, metal coupling layer 202 is or includes a transition metal such as, but not limited to, tungsten, molybdenum, vanadium, niobium, or iridium. In some embodiments, metal coupling layer 202 has a thickness in the range of 0.1 to 1 nm.

Figure 3:
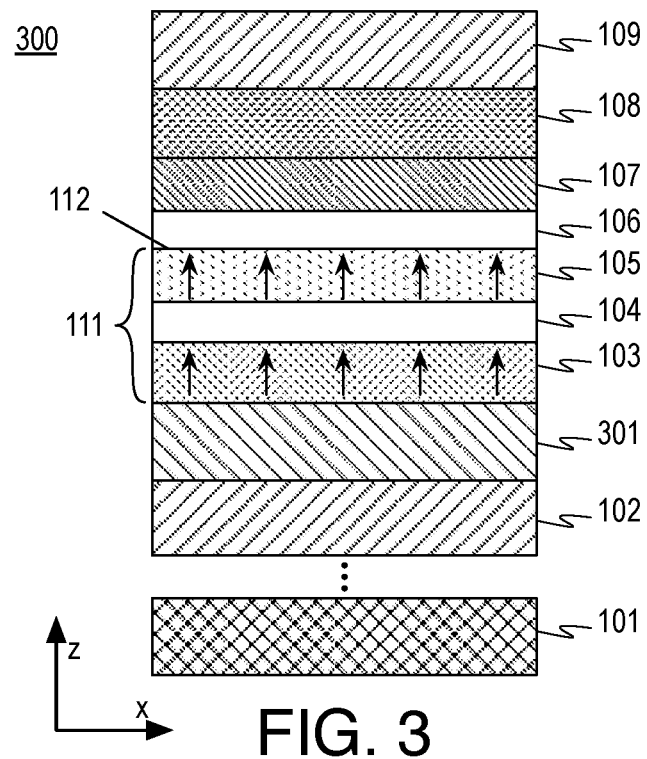
FIG. 3 illustrates a cross-sectional view of a material layer stack including an exemplary synthetic antiferromagnetic (SAF) layer for a perpendicular STTM device.

FIG. 3 illustrates a cross-sectional view of a material layer stack 300 including an exemplary synthetic antiferromagnetic (SAF) layer 301 for a perpendicular STTM device, arranged in accordance with at least some implementations of the present disclosure. For example, material layer stack 300 may be incorporated into any MTJ device discussed herein. Notably, with respect to material layer stack 100, material layer stack 300 includes synthetic antiferromagnetic layer 301 between terminal electrode 102 and fixed magnetic material layer 103. That is, synthetic antiferromagnetic layer 301 is over or on terminal electrode and fixed magnetic material layer 103 is over or on synthetic antiferromagnetic layer 301. Inclusion of synthetic antiferromagnetic layer 301 increases the resiliency of fixed magnetic material layer 103 to accidental flipping.

In an embodiment, free magnetic material layer 105 and fixed magnetic material layer 103 have similar thicknesses and, in the absence of synthetic antiferromagnetic layer 301, an injected electron spin current to change the orientation of magnetization free magnetic material layer 105 (e.g., from parallel to anti-parallel or vice versa) would also affect the magnetization of fixed magnetic material layer 103. Inclusion of synthetic antiferromagnetic layer 301 makes fixed magnetic material layer 103 resistant to changing orientation such that free magnetic material layer 105 and fixed magnetic material layer 103 may have similar thicknesses while still providing the fixed magnetization characteristics of fixed magnetic material layer 103. In some embodiments, free magnetic material layer 105 and fixed magnetic material layer 103 have different thicknesses (e.g., fixed magnetic material layer 103 is thicker) and synthetic antiferromagnetic layer 301 increases the resiliency of fixed magnetic material layer 103 to undesirable accidental changes in magnetization direction. In an embodiment, synthetic antiferromagnetic layer 301 includes a non-magnetic layer between a first magnetic layer and a second magnetic layer. In some embodiments, the first and second magnetic layers each include a metal such as, but not limited to cobalt, nickel, platinum, or palladium. In an embodiment, the non-magnetic layer between the first and second magnetic layers is or includes ruthenium. In an embodiment, the non-magnetic layer between the first and second magnetic layers is ruthenium having a thickness in the range of 0.4 to 1 nm.

Figure 4:
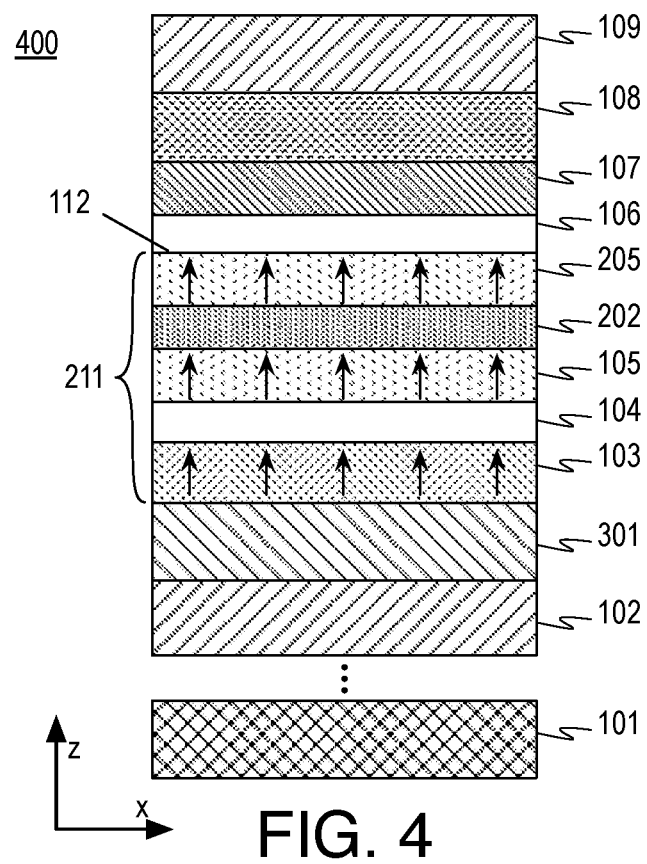
FIG. 4 illustrates a cross-sectional view of a material layer stack including a multi-layer free magnetic material layer and a synthetic antiferromagnetic layer for a perpendicular STTM device.

FIG. 4 illustrates a cross-sectional view of a material layer stack 400 including a multi-layer free magnetic material layer and a synthetic antiferromagnetic layer for a perpendicular STTM device, arranged in accordance with at least some implementations of the present disclosure. For example, material layer stack 400 may be incorporated into any MTJ device discussed herein. Notably, with respect to material layer stack 100, material layer stack 400 includes at least a second free magnetic material layer 205 coupled to free magnetic material layer 105 by an intervening metal coupling layer 202 and synthetic antiferromagnetic layer 301 between terminal electrode 102 and fixed magnetic material layer 103. That is, metal coupling layer 202 is over or on free magnetic material layer 105 and second free magnetic material layer 205 is over or on metal coupling layer 202 and synthetic antiferromagnetic layer 301 is over or on terminal electrode and fixed magnetic material layer 103 is over or on synthetic antiferromagnetic layer 301. As discussed with respect to FIGS. 2 and 3, inclusion of metal coupling layer 202 and second free magnetic material layer 205 increases overall interfacial perpendicular anisotropy in the magnetic tunnel junction 211 and inclusion of synthetic antiferromagnetic layer 301 increases the resiliency of fixed magnetic material layer 103 to accidental flipping.

Figure 5:
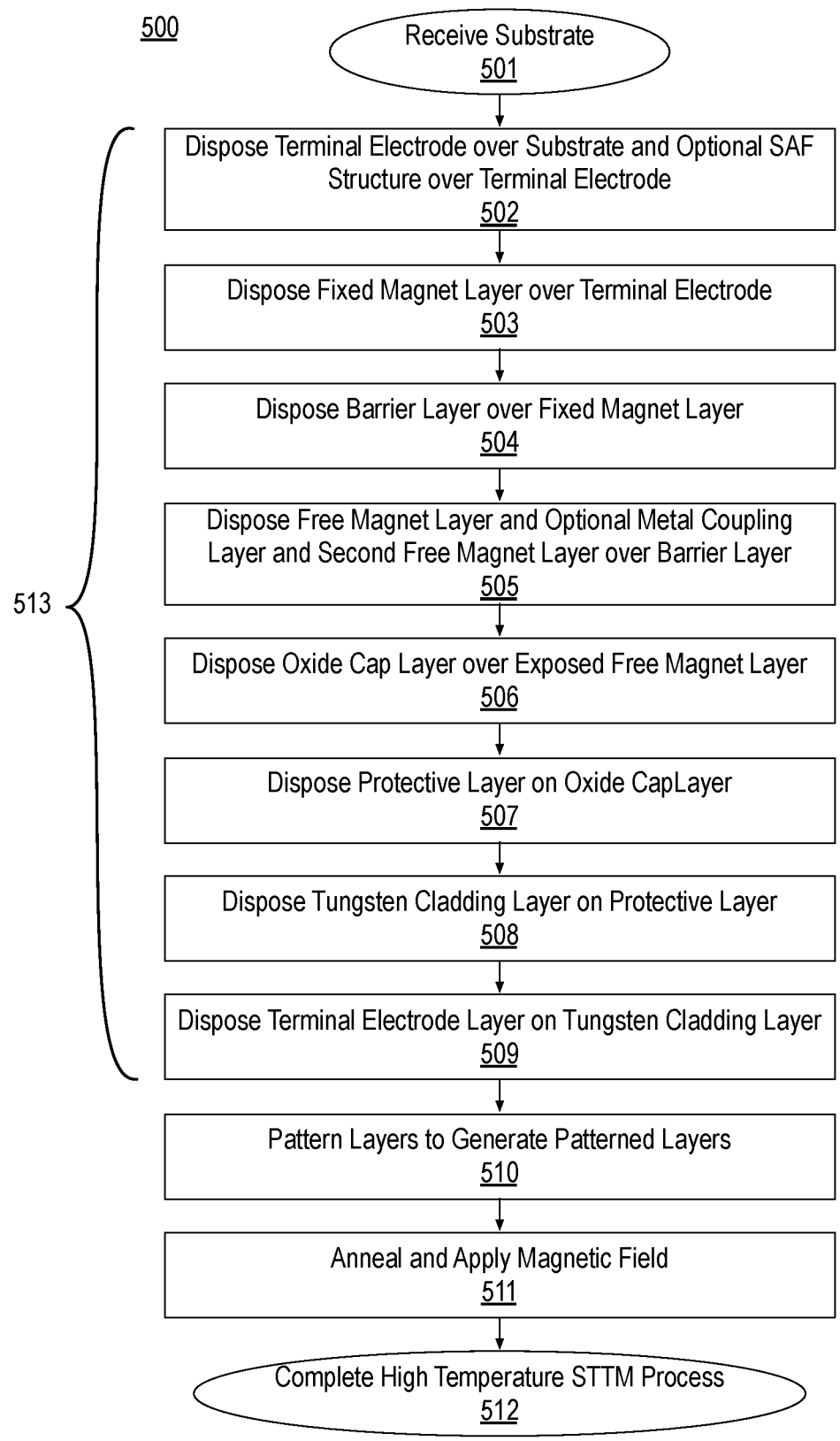
FIG. 5 illustrates a flow diagram illustrating an example process for fabricating magnetic tunnel junction device structures.

FIG. 5 illustrates a flow diagram illustrating an example process 500 for fabricating magnetic tunnel junction device structures, arranged in accordance with at least some implementations of the present disclosure. For example, process 500 may be implemented to fabricate any of material layer stacks 100, 200, 300, 400 as discussed herein and/or memory devices including such material layer stacks. In the illustrated implementation, process 500 may include one or more operations as illustrated by operations 501-512. However, embodiments herein may include additional operations, certain operations being omitted, or operations being performed out of the order provided. In an embodiment, process 500 may fabricate magnetic tunnel junction device structure 650 over substrate 101 as discussed further herein with respect to FIGS. 6A-6D.

Process 500 may begin at operation 501, where a substrate may be received for processing. The substrate may include any suitable substrate such as a silicon wafer or the like. In some embodiments, the substrate includes underlying devices such as transistors and/or electrical interconnects or the like. In an embodiment, substrate 101 may be received and processed as discussed with respect to FIGS. 6A-6D.

Processing may continue at operations 502-509, which may be characterized collectively as disposition or deposition operations 513. At each of operations 502-509, the indicated layer(s) (a terminal electrode layer and optional SAF layers at operation 502, a fixed magnetic material layer at operation 503, a tunnel barrier layer at operation 504, a free magnetic material layer and optional metal coupling layer and optional second free magnetic material layer at operation 505, an oxide cap layer at operation 506, a protective layer at operation 507, a predominantly tungsten cladding layer at operation 508, and a terminal electrode layer at operation 509) may be disposed over or on the layer or layers disposed at the previous operation (or over the received substrate for the terminal electrode layer disposed at operation 502).

Each of the indicated layers may be disposed using any suitable technique or techniques such as deposition techniques. In an embodiment, one, some or all of the layers are deposited using physical vapor deposition (sputter deposition) techniques. As will be appreciated, such layers may be deposited on the layer disposed at the previous operation (or on the received substrate for the terminal electrode layer disposed at operation 502) or an intervening layer or layers may be between the layer being disposed at the current operation and the layer disposed at the previous operation. Furthermore, some of the layers may be optional. In an embodiment, the layers disposed at operations 513 are deposited in situ (e.g., in place without being moved or altered between operations) without exposing the layers to an atmospheric environment between such depositions. For example, the layers disposed at operations 513 may be deposited using sequential in situ physical vapor depositions.

For example, at operation 502, a terminal electrode layer (e.g., metal) is disposed on or over the substrate received at operation 501 using any suitable technique or techniques such as deposition techniques (e.g., physical vapor deposition). The terminal electrode layer may have any characteristics discussed herein with respect to terminal electrode 102. As shown, at operation 502, optional SAF structure layers (e.g., a first magnetic layer, a non-magnetic layer, and a second magnetic layer) may be disposed on or over the terminal electrode layer using any suitable technique or techniques such as deposition techniques (e.g., physical vapor deposition). The SAF structure layers may have any characteristics discussed herein with respect to synthetic antiferromagnetic layer 301.

At operation 503, a fixed magnetic material layer is disposed on or over the terminal electrode layer or SAF structure layers using any suitable technique or techniques such as deposition techniques (e.g., physical vapor deposition). The fixed magnet layer may have any characteristics discussed herein with respect to fixed magnetic material layer 103. In an embodiment, depositing the fixed magnetic material layer includes depositing a layer of amorphous CoFeB over a substrate. At operation 504, a tunnel barrier layer is disposed on or over the fixed magnet layer using any suitable technique or techniques such as deposition techniques (e.g., physical vapor deposition). The tunnel barrier layer may have any characteristics discussed herein with respect to tunnel barrier layer 104. In an embodiment, depositing the tunnel barrier layer includes depositing a layer of dielectric material over or on the fixed magnetic material layer (e.g., amorphous CoFeB). At operation 505, a free magnetic material layer is disposed on or over the tunnel barrier layer using any suitable technique or techniques such as deposition techniques (e.g., physical vapor deposition). The free magnetic material layer may have any characteristics discussed herein with respect to free magnetic material layer 105. In an embodiment, depositing the fixed magnetic material layer includes depositing a layer of amorphous CoFeB over the tunnel barrier layer (e.g., the dielectric material layer). For example, the discussed amorphous CoFeB free and fixed magnetic material layers may be later annealed to covert them to polycrystalline CoFeB.

As shown, at operation 505, an optional metal coupling layer and second free magnetic material layer may be disposed on or over the free magnetic material layer using any suitable technique or techniques such as deposition techniques (e.g., physical vapor deposition). The metal coupling layer and second free magnetic material layer may have any characteristics discussed herein with respect to metal coupling layer 202 and second free magnetic material layer 205. In an embodiment, depositing the second free magnetic material layer includes depositing a layer of amorphous CoFeB. At operation 506, an oxide cap layer is disposed on or over the free magnetic material layer or second free magnetic material layer using any suitable technique or techniques such as deposition techniques (e.g., physical vapor deposition). The oxide cap layer may have any characteristics discussed herein with respect to oxide layer 106. At operation 507, a protective layer is disposed on the oxide layer using any suitable technique or techniques such as deposition techniques (e.g., physical vapor deposition). The protective layer may have any characteristics discussed herein with respect protective layer 107. In an embodiment, the protective layer includes cobalt and iron. In an embodiment, the protective layer includes cobalt, iron, and boron. At operation 508, a predominantly tungsten cladding layer is disposed on or over the protective layer using any suitable technique or techniques such as deposition techniques (e.g., physical vapor deposition). The tungsten cladding layer may have any characteristics discussed herein with respect to tungsten cladding layer 108. At operation 509, a terminal electrode layer is disposed on or over the tungsten cladding layer using any suitable technique or techniques such as deposition techniques (e.g., physical vapor deposition). The terminal electrode layer may have any characteristics discussed herein with respect to terminal electrode 109.

Processing continues from operations 513 at operation 510 where the layers deposited at operations 513 are patterned. As discussed, in some embodiments, one or more of the layers illustrated in operations 513 may be skipped. The layers received at operation 510 are patterned using any suitable technique or techniques such as photolithography operations or the like. In an embodiment, a photoresist pattern is provided, the terminal electrode layer disposed at operation 509 is patterned and used as a hard mask to pattern the underlying layers. Operation 510 generate patterned layers including a patterned bottom or first terminal electrode layer, a patterned SAF layer (if implemented), a patterned fixed magnetic material layer, a patterned tunnel barrier layer, a patterned free magnetic material layer, a patterned metal coupling layer (if implemented), a patterned second free magnetic material layer (if implemented), a patterned oxide (cap) layer, a patterned protective layer, a patterned tungsten cladding layer, and a patterned top or second terminal electrode.

Processing continues at operation 511, where the patterned layers are annealed and a magnetic field may be applied, as needed, to the patterned layers to generate a magnetic tunnel junction device structure. Such annealing is performed at any suitable temperature(s) and duration(s) to set the crystalline structure of the barrier layer and/or to drive boron from one or more of the patterned free magnet layer, the patterned fixed magnet layer, or patterned in-line magnet layer, if applicable. In an embodiment, the annealing converts amorphous CoFeB magnetic material layers to polycrystalline CoFeB. In an embodiment, the anneal operation(s) have a maximum temperature in the range of about 350 to 400° C. Furthermore, the applied magnetic field is applied at any suitable field strength such as 1 to 5 Teslas for any suitable duration. Such magnetic field application may establish the magnetism of one or more layers of the free magnetic material layer(s) or the fixed magnetic material layer. The anneal and magnetic field application may be performed separately or at least partially simultaneously. Furthermore, in some embodiments, such anneal processing is implemented after (e.g., immediately after) after disposing (e.g., via deposition) of the terminal electrode layer, as discussed with respect to operation 509, and prior to patterning as discussed with respect to operation 510. Such anneal processing after disposing the terminal electrode layer may achieve the above discussed crystallinity prior to patterning.

Processing continues and completes at operation 512, where high temperature STTM and/or metal-oxide-semiconductor (MOS) transistor integrated circuit (IC) processing is performed, for example, at a temperature of at least 400° C. Any standard microelectronic fabrication processes such as lithography, etch, thin film deposition, planarization (e.g., CMP), and the like may be performed to complete interconnection of an STTM device implementing any of any of material layer stacks 100, 200, 300, 400 or a subset of the material layers therein.

Figure 6A:
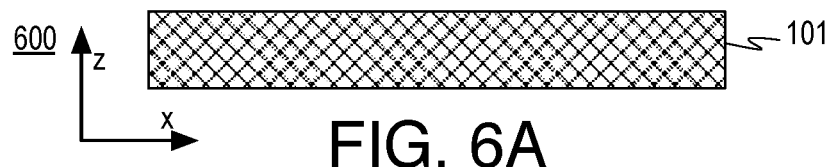
FIGS. 6A, 6B, 6C, 6D illustrate side views of example magnetic tunnel junction device structures as particular fabrication operations are performed.

FIGS. 6A, 6B, 6C, 6D illustrate side views of example magnetic tunnel junction device structures as particular fabrication operations are performed, arranged in accordance with at least some implementations of the present disclosure. As shown in FIG. 6A, magnetic tunnel junction device structure 600 includes substrate 101. For example, substrate 101 may be any substrate such as a substrate wafer received at operation 501. In some examples, substrate 101 is or includes a semiconductor material such as monocrystalline silicon substrate, a silicon on insulator, etc. In various examples, substrate 101 includes metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

Figure 6B:
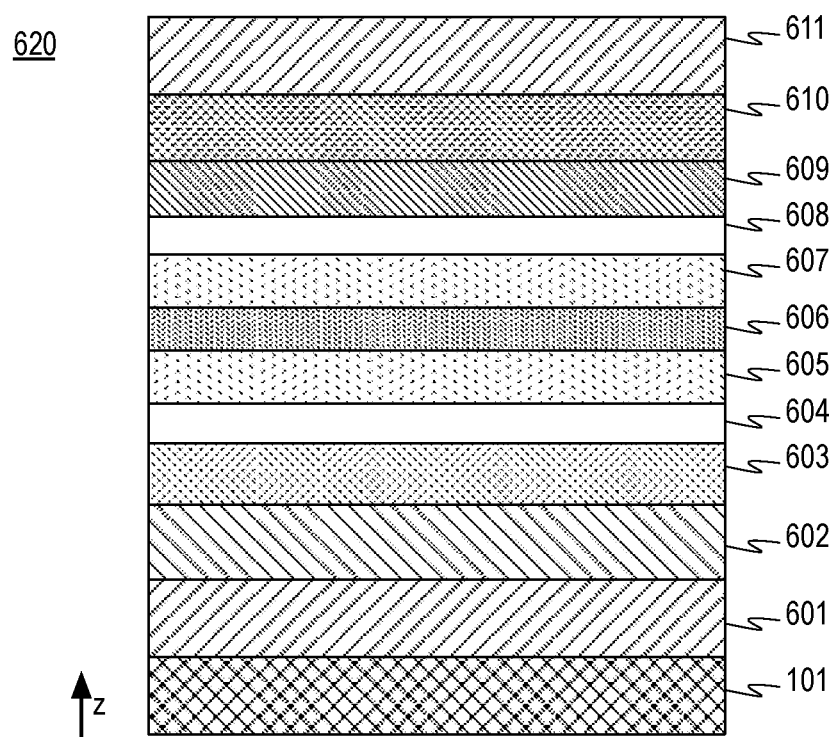

FIG. 6B illustrates a magnetic tunnel junction device structure 620 similar to magnetic tunnel junction device structure 600, after the disposition of a terminal electrode layer 601, a SAF structure layer or layers 602, a fixed magnetic material layer 603 (e.g., an amorphous CoFeB), a tunnel barrier layer 604, a free magnetic material layer 605 (e.g., an amorphous CoFeB), a metal coupling layer 606, a second free magnetic material layer 607 (e.g., an amorphous CoFeB), an oxide cap layer 608, a protective layer 609, a predominantly tungsten cladding layer 610, and a terminal electrode layer 611. The illustrated layers are formed using any suitable technique or techniques such as deposition techniques including physical vapor deposition or any other operations discussed with respect to operations 513 or elsewhere herein. As shown, the illustrated layers may be formed in a bulk manner over substrate 101 and in a horizontal manner (e.g., along the x-y plane of substrate 101). As discussed, SAF structure layer or layers 602, metal coupling layer 606, and second free magnetic material layer 607 are optional and may not be disposed in some embodiments. In an embodiment, fixed magnetic material layer 603 is disposed on terminal electrode layer 601. In an embodiment, oxide cap layer 608 is disposed on free magnetic material layer 605.

Figure 6C:
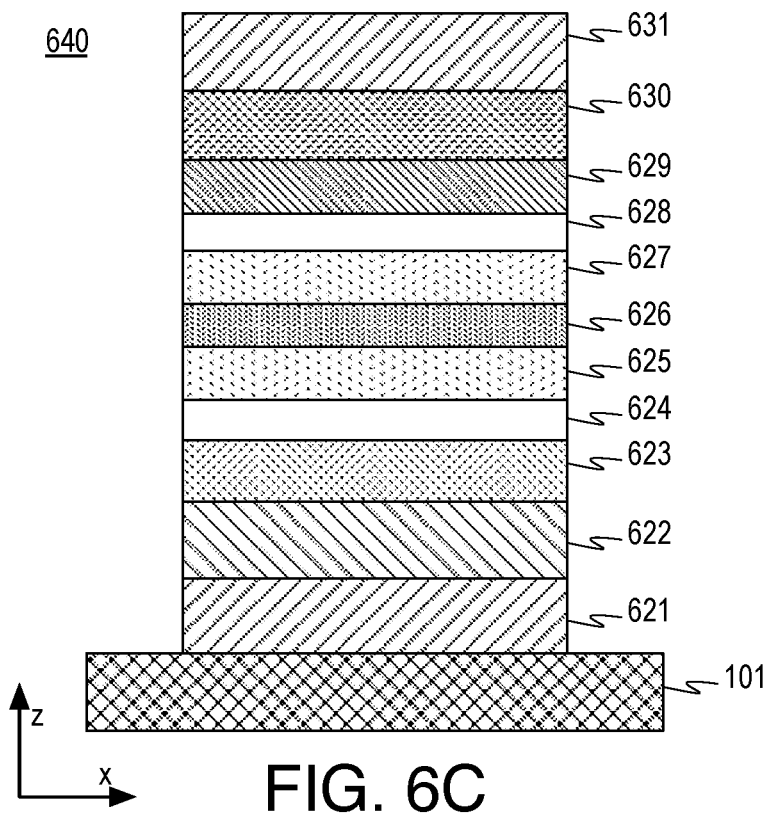

FIG. 6C illustrates a magnetic tunnel junction device structure 640 similar to magnetic tunnel junction device structure 620, after the patterning of terminal electrode layer 601, SAF structure layer or layers 602, fixed magnetic material layer 603, tunnel barrier layer 604, free magnetic material layer 605, metal coupling layer 606, second free magnetic material layer 607, oxide cap layer 608, protective layer 609, predominantly tungsten cladding layer 610, and terminal electrode layer 611 to provide or form a patterned terminal electrode layer 621, a patterned SAF structure layer or layers 622, a patterned fixed magnetic material layer 623, a patterned tunnel barrier layer 624, a patterned free magnetic material layer 625, a patterned metal coupling layer 626, a patterned second free magnetic material layer 627, a patterned oxide cap layer 628, a patterned protective layer 629, a patterned predominantly tungsten cladding layer 630, and a patterned terminal electrode layer 631. In an embodiment, photolithography techniques are used to provide a patterned resist layer over terminal electrode layer 611 and etch techniques may be used to pattern the illustrated layers. In an embodiment, the pattern of the resist layer is transferred to terminal electrode layer 611, which may be used as a hardmask to pattern the other layers. For example, terminal electrode layer 611 and/or patterned terminal electrode layer 631 may be characterized as a hardmask layer.

Figure 6D:
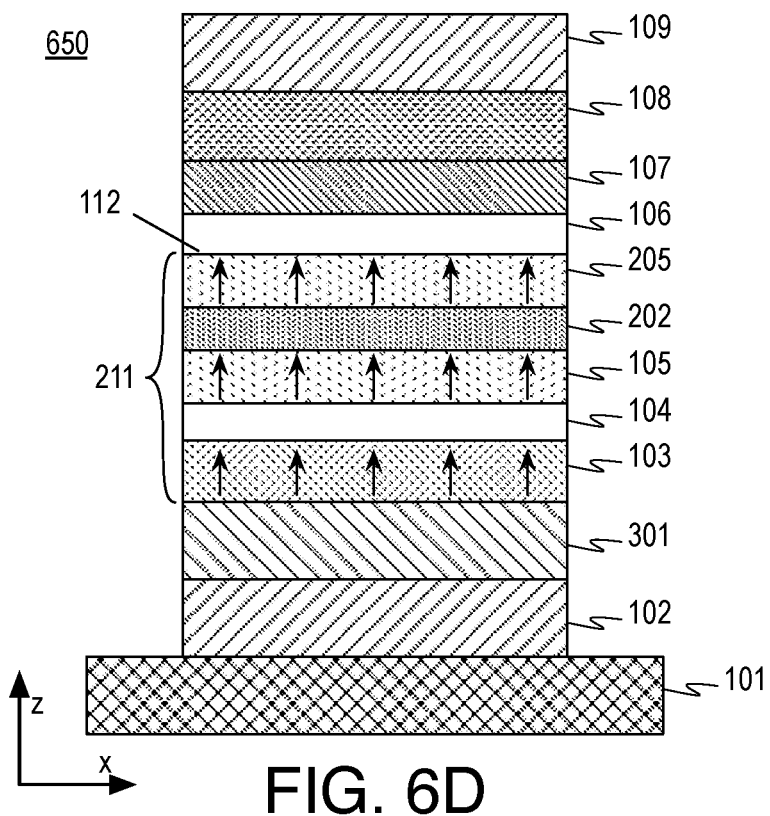

FIG. 6D illustrates a magnetic tunnel junction device structure 650 similar to magnetic tunnel junction device structure 640, after one or more annealing operations and the application of a magnetic field to magnetic tunnel junction device structure 640 to provide terminal electrode 102, synthetic antiferromagnetic layer 301, fixed magnetic material layer 103, tunnel barrier layer 104, free magnetic material layer 105, metal coupling layer 202, second free magnetic material layer 205, oxide layer 106, protective layer 107, predominantly tungsten cladding layer 108, and terminal electrode 109 as discussed herein with respect to FIG. 4. As discussed, in some embodiments, the operations described with respect to FIGS. 6A, 6B, 6C, 6D exclude the formation of synthetic antiferromagnetic layer 301 and/or the formation of metal coupling layer 202 and second free magnetic material layer 205 to form magnetic tunnel junction device structures as discussed with respect to FIGS. 1, 2, and 3.

The discussed annealing operation(s) are performed at any suitable temperature(s) and duration(s). In an embodiment, the anneal operation(s) have a maximum temperature in the range of 350 to 400° C. Such annealing operation(s) may crystallize MgO in tunnel barrier layer 104 and/or match the crystalline structure of tunnel barrier layer 104 to adjoining CoFeB magnetic material layers and/or drive boron from one or more of fixed magnetic material layer 103, free magnetic material layer 105, and second free magnetic material layer 205. Furthermore, the applied magnetic field is at any suitable field strength such as 1 to 5 Teslas for any suitable duration. Such magnetic field application establishes the magnetism of one or more layers of fixed magnetic material layer 103, free magnetic material layer 105, and second free magnetic material layer 205. In an embodiment, the annealing and magnetic field application may be performed at least partially simultaneously such that the annealing is performed in the presence of a 1 to 5 Tesla magnetic field. For example, the annealing duration and the magnetic field application durations may at least partially overlap. In other embodiments, the annealing and magnetic field application may be performed separately.

FIGS. 6A, 6B, 6C, 6D illustrate an example process flow for the fabrication of material layer stacks 100, 200, 300, 400 or other magnetic tunnel junction material stacks or device structures as discussed herein. In various examples, additional operations may be included or certain operations may be omitted. In particular, the illustrated process may include depositing a first layer of amorphous CoFeB over a substrate, depositing a first layer of dielectric material over the first layer of amorphous CoFeB, depositing a second layer of amorphous CoFeB over the first layer of dielectric material, depositing an oxide layer over the second layer of amorphous CoFeB, depositing a protective layer comprising at least Co and Fe on the oxide layer, depositing a cladding layer on the protective layer a cladding layer on the protective layer, wherein the cladding layer is predominantly tungsten, and annealing the magnetic tunnel junction material stack to convert the first and second layers of amorphous CoFeB to polycrystalline CoFeB.

Figure 7:
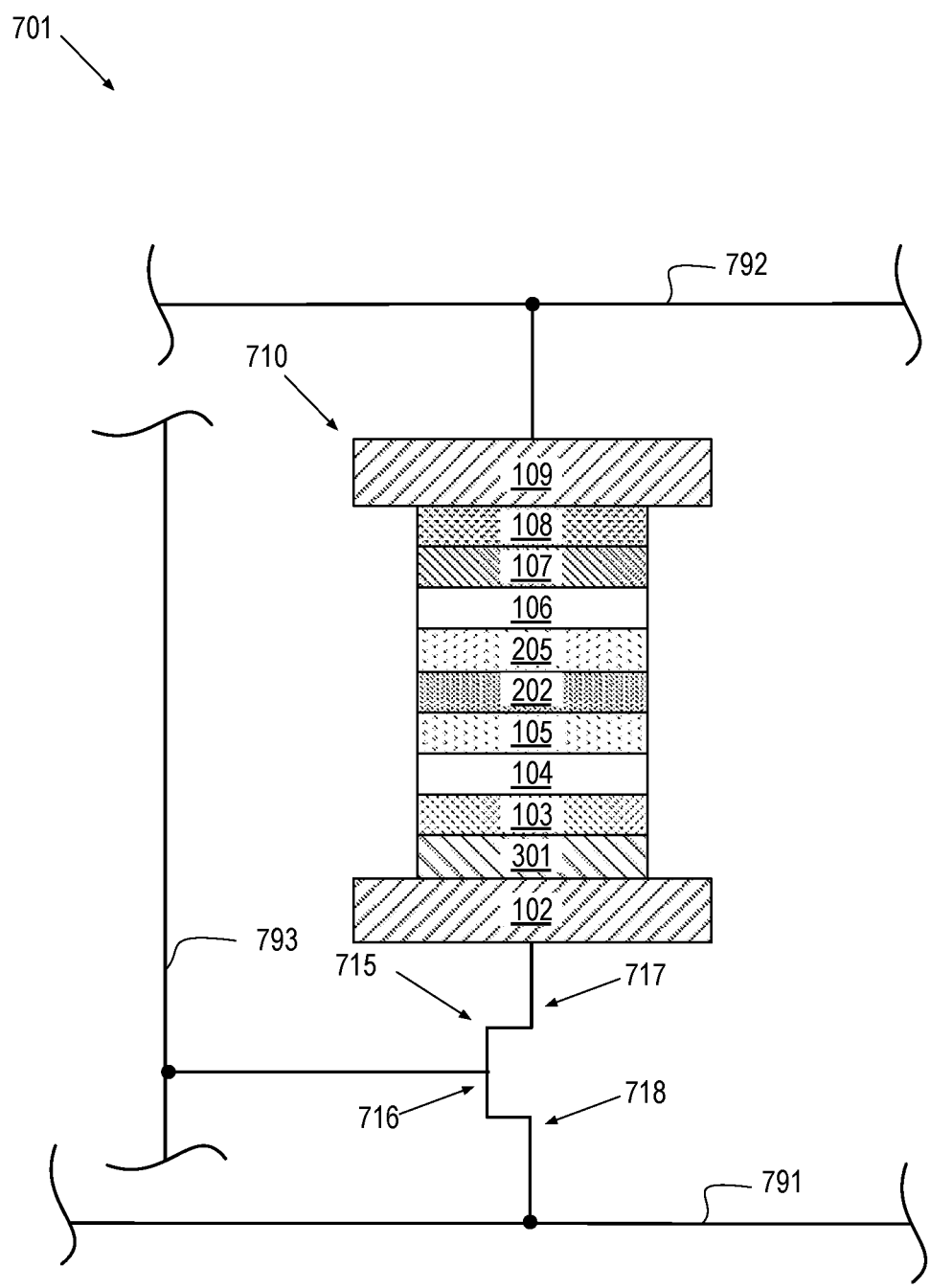
FIG. 7 illustrates a schematic of a non-volatile memory device including a magnetic tunnel junction device structure having a predominantly tungsten cladding layer.

FIG. 7 illustrates a schematic of a non-volatile memory device 701 including a magnetic tunnel junction device structure having a predominantly tungsten cladding layer, arranged in accordance with at least some implementations of the present disclosure. For example, non-volatile memory device 701 may provide a spin transfer torque memory (STTM) bit cell of a spin transfer torque random access memory (STTRAM). Non-volatile memory device 701 may be implemented in any suitable component or device or the like such as any component discussed with respect to FIGS. 9 and 10. In an embodiment, non-volatile memory device 701 is implemented in a non-volatile memory that is coupled to a processor. For example, the non-volatile memory and processor may be implemented by a system having any suitable form factor. In an embodiment, the system further includes an antenna and a battery such that each of the antenna and the battery are coupled to the processor.

As shown, non-volatile memory device 701 includes a magnetic tunnel junction device structure 710. In the illustrated embodiment, magnetic tunnel junction device structure 710 includes terminal electrode 102, synthetic antiferromagnetic layer 301, fixed magnetic material layer 103, tunnel barrier layer 104, free magnetic material layer 105, metal coupling layer 202, second free magnetic material layer 205, oxide layer 106, protective layer 107, predominantly tungsten cladding layer 108, and terminal electrode 109 (i.e., material layer stack 400). In other embodiments, non-volatile memory device 701 includes a magnetic tunnel junction device structure implementing material layer stack 100, material layer stack 200, or material layer stack 300. As discussed herein, fixed magnetic material layer 103, free magnetic material layer 105, and second free magnetic material layer 205 have perpendicular magnetic anisotropy. Furthermore, magnetic tunnel junction device structure 710 includes predominantly tungsten cladding layer 108 on protective layer 107. Also as shown, magnetic tunnel junction device structure 710 includes terminal electrodes 102, 109, which are coupled to circuitry of non-volatile memory device 701 as discussed below.

Non-volatile memory device 701 includes a first metal interconnect 792 (e.g., a bit line), a second metal interconnect 791 (e.g., a source line), a transistor 715 (e.g., a select transistor) having a first terminal 716, a second terminal 717, and a third terminal 718, and a third metal interconnect 793 (e.g., a word line). Terminal electrode 109 of magnetic tunnel junction device structure 710 is coupled to first metal interconnect 792 and terminal electrode 102 of magnetic tunnel junction device structure 710 is coupled to second terminal 717 of transistor 715. In an alternative embodiment, terminal electrode 102 of magnetic tunnel junction device structure 710 is coupled to first metal interconnect 792 and terminal electrode 109 of magnetic tunnel junction device structure 710 is coupled to second terminal 717 of transistor 715 (i.e., with the entirety of magnetic tunnel junction device structure 710 flipping over. First terminal 716 (e.g., a gate terminal) of transistor 715 is coupled to third metal interconnect 793 and third terminal 718 of transistor 715 is coupled to second metal interconnect 791. Such connections may be made in any manner conventional in the art. Non-volatile memory device 701 may further include additional read and write circuitry (not shown), a sense amplifier (not shown), a bit line reference (not shown), and the like, as understood by those skilled in the art of non-volatile memory devices. A plurality of non-volatile memory devices 701 may be operably connected to one another to form a memory array (not shown) such that the memory array may be incorporated into a non-volatile memory device.

In operation, non-volatile memory device 701 uses the previously discussed magnetic tunnel junction for switching and detection of the memory state of non-volatile memory device 701. For example, non-volatile memory device 701 is read by accessing or sensing the memory state as implemented by a parallel or non-parallel magnetic direction of free magnetic material layer 105 (and/or second free magnetic material layer 205) of the magnetic tunnel junction. More specifically, the magnetoresistance of the magnetic tunnel junction of non-volatile memory device 701 is established by the magnetic direction stored by the free magnetic material layer(s) with respect to the fixed magnetic material layer(s). When the magnetic directions are substantially parallel, the magnetic tunnel junction has a low resistance state and, when the magnetic directions are substantially anti-parallel, the magnetic tunnel junction has a high resistance state. Such a low or high resistance state may be detected via the circuitry of non-volatile memory device 701. For write operations, the magnetic direction of the free magnet layer(s) are optionally switched between parallel and anti-parallel directions by passing, again via the circuitry of non-volatile memory device 701, a driving current polarized by fixed magnet layer 103 through the free magnet layer(s) such that, for example, a positive voltage switches the magnetization direction of the free magnet layer(s) to anti-parallel and a negative voltage switches the magnetization direction of the free magnet layer(s) to parallel or vice versa.

As discussed herein, predominantly tungsten cladding layer 108 reduces the amount of oxygen removed from oxide layer 106 relativize to other cladding layer materials such that non-volatile memory device 701 has improved thermal stability and retention.

The magnetic tunnel junction device structures and material layer stacks discussed herein may be provided in any suitable device (e.g., STTM, STTRAM, etc.) or platform (e.g., computing, mobile, automotive, internet of things, etc.) using any suitable die layout, architecture or the like. Furthermore, non-volatile memory device 701 or any magnetic tunnel junction device structures may be located on a substrate such as a bulk semiconductor material as part of a wafer. In an embodiment, the substrate is a bulk semiconductor material as part of a chip that has been separated from a wafer. One or more layers of interconnects and/or devices may be between the magnetic tunnel junction device structures and the substrate and/or one or more layers of interconnects and/or devices may be between the magnetic tunnel junction device structures and interconnects above the magnetic tunnel junction device structures.

Figure 8:
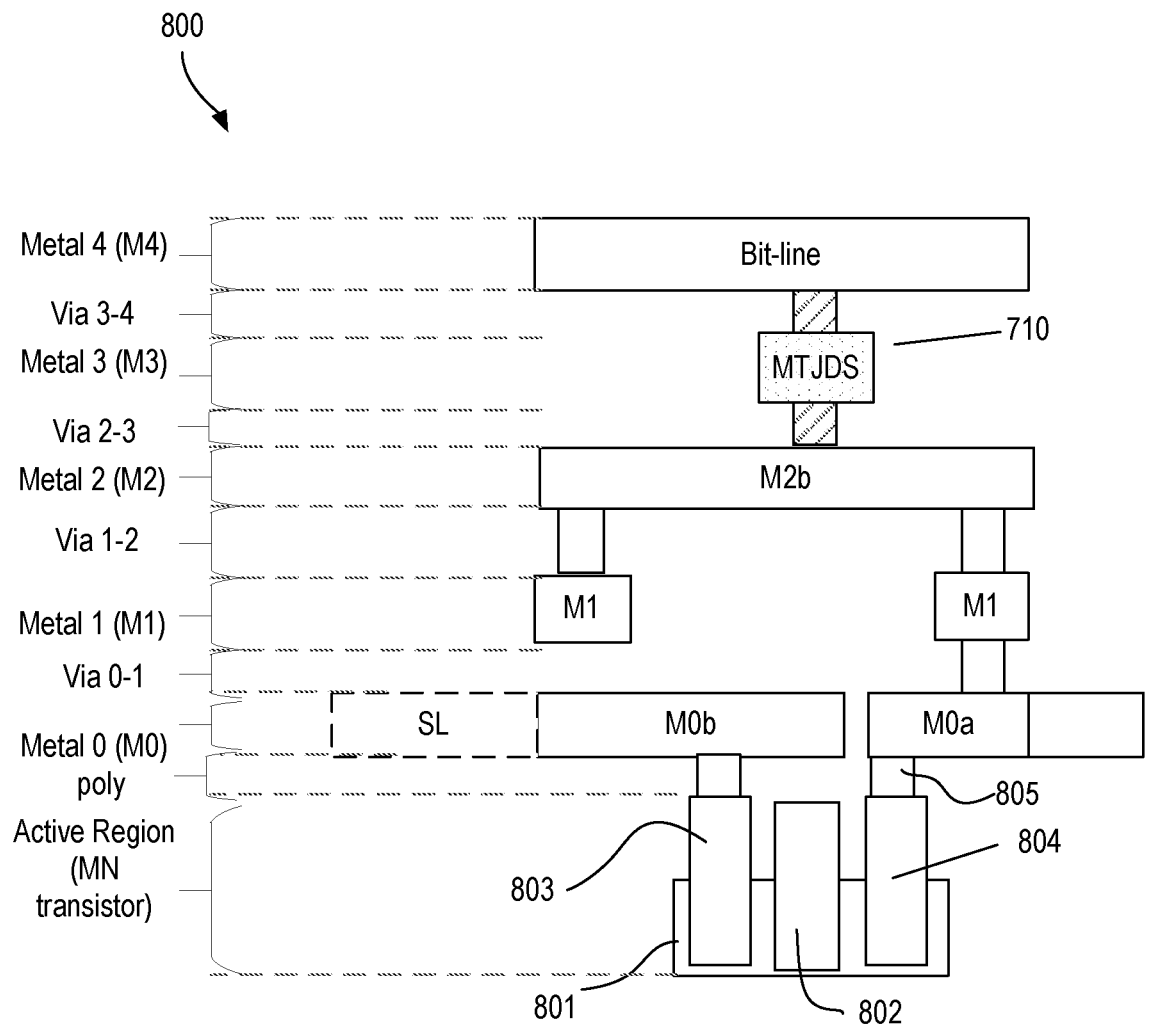
FIG. 8 illustrates an example cross-sectional die layout including the example magnetic tunnel junction device structure of FIG. 7.

FIG. 8 illustrates an example cross-sectional die layout 800 including example magnetic tunnel junction device structure 710, arranged in accordance with at least some implementations of the present disclosure. For example, cross-sectional die layout 800 illustrates magnetic tunnel junction device structure 710 formed in metal 3 (M3) and metal 2 (M2) layer regions thereof. Although illustrated with respect to magnetic tunnel junction device structure 710, any magnetic tunnel junction device structure or material layer stack discussed herein may be implemented in the die layout of FIG. 8. As shown in FIG. 8, cross-sectional die layout 800 illustrates an active region having a transistor MN including diffusion region 801, a gate terminal 802, a drain terminal 804, and a source terminal 803. For example, transistor MN may implement transistor 715 (with gate terminal 802 being first terminal 716, drain terminal 804 being second terminal 717, and source terminal 803 being third terminal 718), the source line (SL) may implement second metal interconnect 791, and the bit-line may implement first metal interconnect 792.

As shown, source terminal 803 is coupled to SL (source line) via poly or via, where the SL is formed in metal 0 (M0). In some embodiments, drain terminal 804 is coupled to M0a (also in metal 0) through a via 805. Drain terminal 804 is coupled to magnetic tunnel junction device structure 710 through via 0-1 (e.g., a via layer that connects metal 0 to metal 1 layers), metal 1 (M1), via 1-2 (e.g., a via layer that connects metal 1 to metal 2 layers), and metal 2 (M2). Magnetic tunnel junction device structure 710 is coupled to a bit-line in metal 4 (M4). In some embodiments, magnetic tunnel junction device structure 710 is formed in the metal 3 (M3) region. In some embodiments, transistor MN is formed in or on the front side of a die while magnetic tunnel junction device structure 710 is located in or the back end of the die. In some embodiments, magnetic tunnel junction device structure 710 is located in the back-end metal layers or via layers for example in Via 3.

Although illustrated with magnetic tunnel junction device structure 710 formed in metal 3 (M3), magnetic tunnel junction device structure 710 may be formed in any suitable layer of cross-sectional die layout 800. In some embodiments, magnetic tunnel junction device structure 710 is formed in metal 2 and/or metal 1 layer regions. In such embodiments, magnetic tunnel junction device structure 710 may directly connect to M0a and the bit-line may be formed in metal 3 or metal 4.

Figure 9:
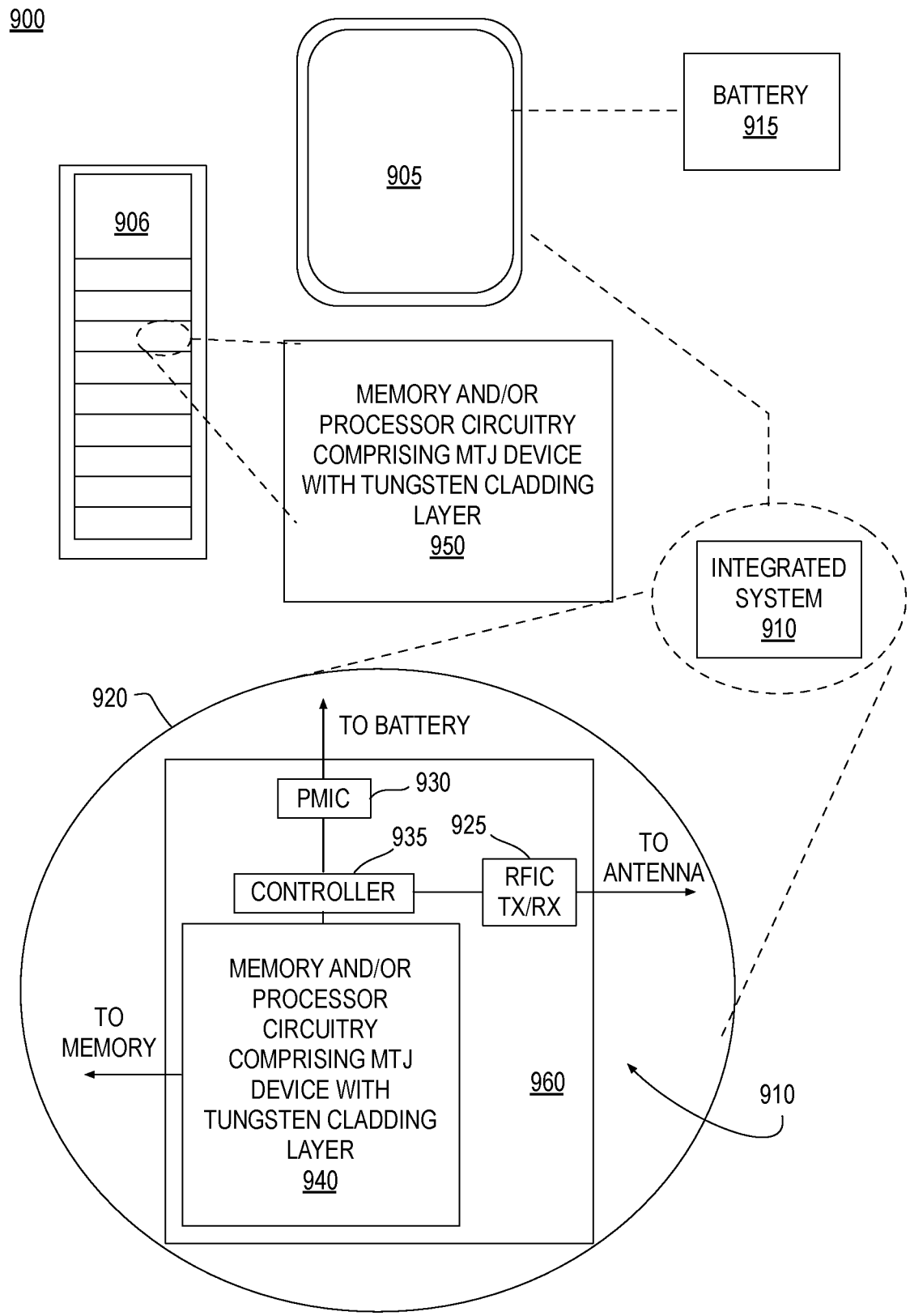
FIG. 9 illustrates a system in which a mobile computing platform and/or a data server machine employs a magnetic tunnel junction device having a predominantly tungsten cladding layer.

FIG. 9 illustrates a system 900 in which a mobile computing platform 905 and/or a data server machine 906 employs a magnetic tunnel junction device having a predominantly tungsten cladding layer, arranged in accordance with at least some implementations of the present disclosure.

Data server machine 906 may be any commercial server, for example, including any number of high-performance computing platforms disposed within a rack and networked together for electronic data processing, which in the exemplary embodiment includes a packaged device 950. For example, device 950 (e.g., a memory or processor) may include a magnetic tunnel junction device having a in predominantly tungsten cladding layer. In an embodiment, device 950 includes a non-volatile memory including a magnetic tunnel junction device having a predominantly tungsten cladding layer such as any magnetic tunnel junction device structure and/or material layer stack discussed herein. As discussed below, in some examples, device 950 may include a system on a chip (SOC) such as SOC 960, which is illustrated with respect to mobile computing platform 905.

Mobile computing platform 905 may be any portable device configured for each of electronic data display, electronic data processing, wireless electronic data transmission, or the like. For example, mobile computing platform 905 may be any of a tablet, a smart phone, a laptop computer, etc., and may include a display screen (e.g., a capacitive, inductive, resistive, or optical touchscreen), a chip-level or package-level integrated system 910, and a battery 915. Although illustrated with respect to mobile computing platform 905, in other examples, chip-level or package-level integrated system 910 and a battery 915 may be implemented in a desktop computing platform, an automotive computing platform, an internet of things platform, or the like.

Whether disposed within integrated system 910 illustrated in expanded view 920 or as a stand-alone packaged device within data server machine 906, SOC 960 may include memory circuitry and/or processor circuitry 940 (e.g., RAM, a microprocessor, a multi-core microprocessor, graphics processor, etc.), a PMIC 930, a controller 935, and a radio frequency integrated circuit (RFIC) 925 (e.g., including a wideband RF transmitter and/or receiver (TX/RX)). As shown, one or more magnetic tunnel junction devices having a predominantly tungsten cladding layer such as any magnetic tunnel junction device structures and/or material layer stacks discussed herein may be employed via memory circuitry and/or processor circuitry 940. In some embodiments, RFIC 925 includes a digital baseband and an analog front-end module further comprising a power amplifier on a transmit path and a low noise amplifier on a receive path). Functionally, PMIC 930 may perform battery power regulation, DC-to-DC conversion, etc., and so has an input coupled to battery 915, and an output providing a current supply to other functional modules. As further illustrated in FIG. 9, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Memory circuitry and/or processor circuitry 940 may provide memory functionality for SOC 960, high level control, data processing and the like for SOC 960. In alternative implementations, each of the SOC modules may be integrated onto separate ICs coupled to a package substrate, interposer, or board.

Figure 10:
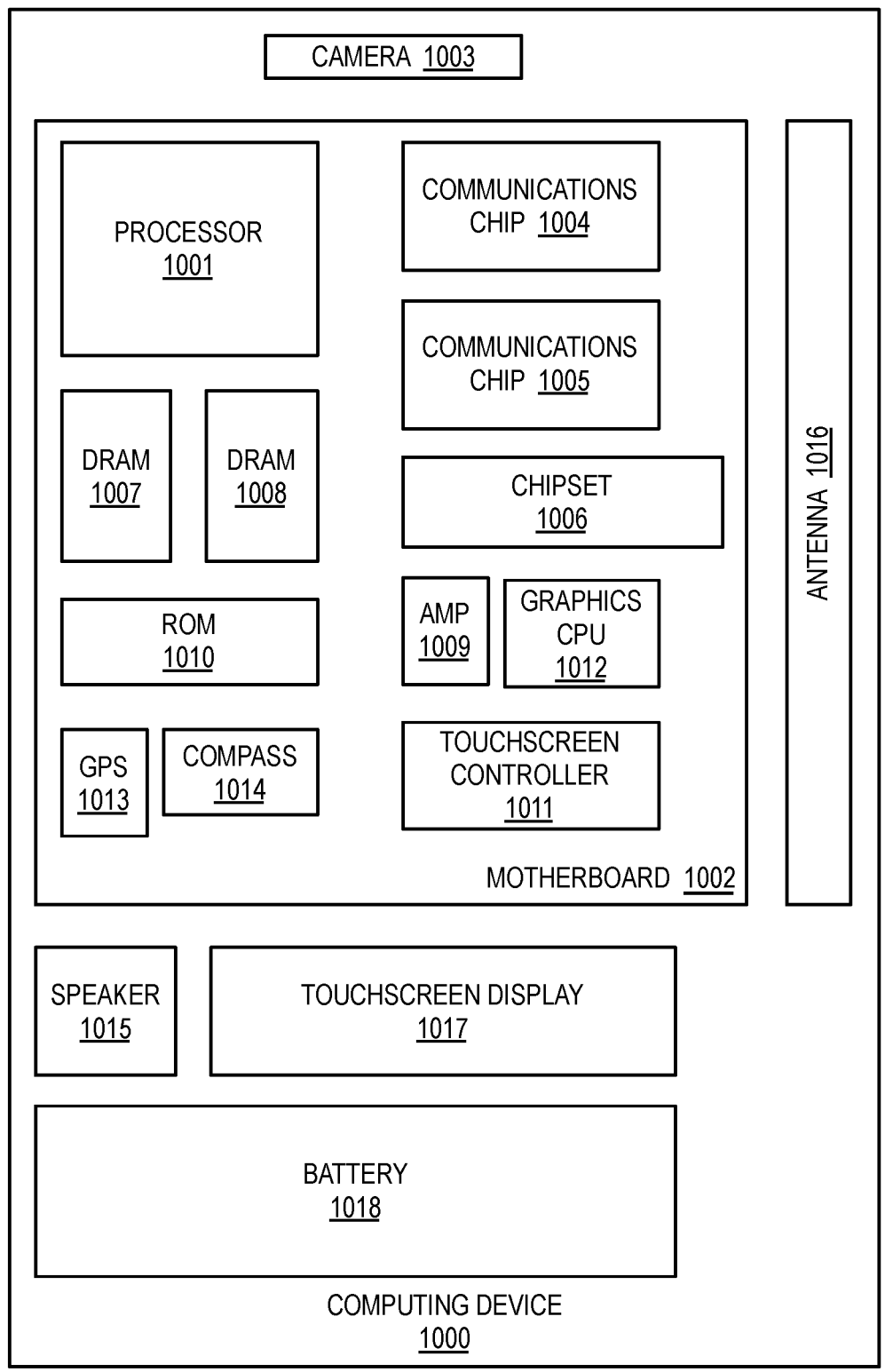
FIG. 10 illustrates a functional block diagram of a computing device, all arranged in accordance with at least some implementations of the present disclosure.

FIG. 10 is a functional block diagram of a computing device 1000, arranged in accordance with at least some implementations of the present disclosure. Computing device 1000 or portions thereof may be implemented via one or both of data server machine 906 or mobile computing platform 905, for example, and further includes a motherboard 1002 hosting a number of components, such as but not limited to a processor 1001 (e.g., an applications processor) and one or more communications chips 1004, 1005. Processor 1001 may be physically and/or electrically coupled to motherboard 1002. In some examples, processor 1001 includes an integrated circuit die packaged within the processor 1001. In general, the term "processor" may refer to any device or portion of a device that processes electronic data from registers and/or memory to transform that electronic data into other electronic data that may be stored in registers and/or memory.

In various examples, one or more communication chips 1004, 1005 may also be physically and/or electrically coupled to the motherboard 1002. In further implementations, communication chips 1004 may be part of processor 1001. Depending on its applications, computing device 1000 may include other components that may or may not be physically and electrically coupled to motherboard 1002. These other components may include, but are not limited to, volatile memory (e.g., DRAM) 1007, 1008, non-volatile memory (e.g., ROM) 1010, a graphics processor 1012, flash memory, global positioning system (GPS) device 1013, compass 1014, a chipset 1006, an antenna 1016, a power amplifier 1009, a touchscreen controller 1011, a touchscreen display 1017, a speaker 1015, a camera 1003, and a battery 1018, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1004, 1005 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1004, 1005 may implement any of a number of wireless standards or protocols, including but not limited to those described elsewhere herein. As discussed, computing device 1000 may include a plurality of communication chips 1004, 1005. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, any component of computing device 1000 may include or utilize one or more magnetic tunnel junction devices having a predominantly tungsten cladding layer such as any magnetic tunnel junction device structure(s) and/or material layer stack(s) discussed herein.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It will be recognized that the invention is not limited to the embodiments so described but can be practiced with modification and alteration without departing from the scope of the appended claims. For example, the above embodiments may include specific combinations of features as further provided below.

The following examples pertain to further embodiments.

In one or more first embodiments, a material stack for a spin transfer torque memory device a magnetic junction comprising a free magnetic material layer, a first layer comprising oxygen, the first layer on the free magnetic material layer, a second layer comprising iron, the second layer on the first layer, and a third layer on the second layer, wherein the third layer comprises predominantly tungsten.

In one or more second embodiments, further to the first embodiments, the magnetic junction further comprises a fixed magnetic material layer, the fixed and free magnetic material layers have perpendicular magnetic anisotropy, the second layer further comprises iron, and the third layer is not less than 99% tungsten by weight.

In one or more third embodiments, further to the first or second embodiments, the third layer has a thickness of not less than 0.5 nm and not more than 5 nm.

In one or more fourth embodiments, further to any of the first through third embodiments, the third layer has a thickness of not less than 2 nm and not more than 2.5 nm.

In one or more fifth embodiments, further to any of the first through fourth embodiments, the material stack further comprises an electrode on the third layer, wherein the electrode comprises at least one of ruthenium or tantalum.

In one or more sixth embodiments, further to any of the first through fifth embodiments, the electrode comprises a first electrode layer comprising ruthenium on the third layer and a second electrode layer comprising tantalum on the first electrode layer.

In one or more seventh embodiments, further to any of the first through sixth embodiments, the magnetic junction further comprises a tunnel barrier layer and a fixed magnetic material layer, the free and fixed magnetic material layers each comprise one or more of Co, Fe, or B, the tunnel barrier layer comprises one or more of Mg and O, and the material stack further comprises a synthetic antiferromagnetic (SAF) structure between the fixed magnetic material layer and a metal electrode.

In one or more eighth embodiments, further to any of the first through seventh embodiments, the free magnetic material layer is a first free magnetic material layer and the magnetic junction further comprises a fixed magnetic material layer, a tunnel barrier layer, a second free magnetic material layer on the tunnel barrier layer, and a fourth layer comprising metal, the fourth layer between the first free magnetic material layer and the second free magnetic material layer.

In one or more ninth embodiments, further to any of the first through eighth embodiments, the magnetic junction further comprises a fixed magnetic material layer and a tunnel barrier layer, the fixed and free magnetic material layers and the second layer each comprise Co, Fe, and B, the tunnel barrier layer comprises Mg and O, the material stack further comprises a synthetic antiferromagnetic (SAF) structure between the fixed magnetic material layer and a first metal electrode, the third layer comprises not less than 99% tungsten by weight having a thickness of not less than 1.5 nm and not more than 2.5 nm, and the material stack further comprises a second metal electrode comprising tantalum on the third layer.

In one or more tenth embodiments, a non-volatile memory cell comprises a first electrode, a second electrode electrically coupled to a bit line of a memory array, a perpendicular spin transfer torque memory (pSTTM) device between the first and second electrodes, the pSTTM device comprising a material stack having any elements and characteristics described with respect to the first through ninth embodiments.

In one or more eleventh embodiments, a method of forming a magnetic tunnel junction material stack comprises depositing a first layer of amorphous CoFeB over a substrate, depositing a first layer of dielectric material over the first layer of amorphous CoFeB, depositing a second layer of amorphous CoFeB over the first layer of dielectric material, depositing an oxide layer over the second layer of amorphous CoFeB, depositing a protective layer comprising at least Co and Fe on the oxide layer, depositing a cladding layer on the protective layer, wherein the cladding layer is predominantly tungsten, and annealing the magnetic tunnel junction material stack to convert the first and second layers of amorphous CoFeB to polycrystalline CoFeB.

In one or more twelfth embodiments, further to the eleventh embodiments, depositing the cladding layer comprises depositing the cladding layer to a thickness of not less than 0.5 nm and not more than 5 nm.

In one or more thirteenth embodiments, further to the eleventh or twelfth embodiments, depositing the cladding layer comprises depositing the cladding layer having not less than 99% tungsten by weight.

In one or more fourteenth embodiments, further to any of the eleventh through thirteenth embodiments, depositing the second layer of amorphous CoFeB comprises depositing the second layer of amorphous CoFeB on the first layer of dielectric material and depositing the oxide layer comprises depositing the oxide layer on the second layer of amorphous CoFeB.

In one or more fifteenth embodiments, further to any of the eleventh through fourteenth embodiments, the method further comprises, prior to said annealing, depositing a metal coupling layer on the second layer of amorphous CoFeB and depositing a third layer of amorphous CoFeB on the metal coupling layer.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A material stack for a spin transfer torque memory device, the material stack comprising:
   a magnetic junction comprising a free magnetic material layer;
   a first layer comprising oxygen, the first layer on the free magnetic material layer;
   a second layer comprising cobalt and iron, the second layer on the first layer; and
   a third layer on the second layer, wherein the third layer is not less than 99% tungsten by weight.

2. The material stack of claim 1, wherein the magnetic junction further comprises a fixed magnetic material layer, and wherein the fixed and free magnetic material layers have perpendicular magnetic anisotropy.

3. The material stack of claim 2, wherein the third layer has a thickness of not less than 0.5 nm and not more than 5 nm.

4. The material stack of claim 2, wherein the third layer has a thickness of not less than 2 nm and not more than 2.5 nm.

5. The material stack of claim 1, further comprising:
an electrode on the third layer, wherein the electrode comprises at least one of ruthenium or tantalum.

6. The material stack of claim 5, wherein the electrode comprises a first electrode layer comprising ruthenium on the third layer and a second electrode layer comprising tantalum on the first electrode layer.

7. The material stack of claim 1, wherein the magnetic junction further comprises a tunnel barrier layer and a fixed magnetic material layer, the free and fixed magnetic material layers each comprise one or more of Co, Fe, or B, the tunnel barrier layer comprises one or more of Mg and O, and the material stack further comprises a synthetic antiferromagnetic (SAF) structure between the fixed magnetic material layer and a metal electrode.

8. The material stack of claim 1, wherein the free magnetic material layer is a first free magnetic material layer and the magnetic junction further comprises:
a fixed magnetic material layer;
a tunnel barrier layer;
a second free magnetic material layer on the tunnel barrier layer; and
a fourth layer comprising metal, the fourth layer between the first free magnetic material layer and the second free magnetic material layer.

9. The material stack of claim 1, wherein the magnetic junction further comprises a fixed magnetic material layer and a tunnel barrier layer, the fixed and free magnetic material layers and the second layer each comprise Co, Fe, and B, the tunnel barrier layer comprises Mg and O, the material stack further comprises a synthetic antiferromagnetic (SAF) structure between the fixed magnetic material layer and a first metal electrode, the third layer has a thickness of not less than 1.5 nm and not more than 2.5 nm, and the material stack further comprises a second metal electrode comprising tantalum on the third layer.

10. A non-volatile memory cell comprising:
a first electrode;
a second electrode electrically coupled to a bit line of a memory array;
a perpendicular spin transfer torque memory (pSTTM) device between the first and second electrodes, the pSTTM device comprising:
a magnetic junction comprising a free magnetic material layer;
a first layer comprising oxygen, the first layer on the free magnetic material layer;
a second layer comprising iron, the second layer on the first layer; and
a third layer on the second layer, wherein the third layer is not less than 99% tungsten by weight; and
a transistor with a first terminal electrically coupled to the first electrode, a second terminal electrically coupled to a source line of the memory array, and a third terminal electrically coupled to a word line of the memory array.

11. The non-volatile memory cell of claim 10, wherein the second layer comprises cobalt and the third layer comprises not less than 99% tungsten by weight.

12. The non-volatile memory cell of claim 11, wherein the third layer has a thickness of not less than 0.5 nm and not more than 5 nm.

13. The non-volatile memory cell of claim 11, wherein the third layer has a thickness of not less than 2 nm and not more than 2.5 nm.

14. The non-volatile memory cell of claim 10, wherein the first second electrode comprises a first electrode layer comprising ruthenium on the third layer and a second electrode layer comprising tantalum on the first electrode layer.

15. The non-volatile memory cell of claim 10, wherein the magnetic junction further comprises a tunnel barrier layer and a fixed magnetic material layer, the fixed and free magnetic material layers and the protective layer each comprise Co, Fe, and B, the tunnel barrier layer comprises Mg and O, the pSTTM device further comprises a synthetic antiferromagnetic (SAF) structure between the fixed magnetic material layer and the second electrode, and the third layer comprises not less than 99.9% tungsten by weight having a thickness of not less than 1.5 nm and not more than 2.5 nm.

16. A method of forming a magnetic tunnel junction material stack comprising:
depositing a first layer of amorphous CoFeB over a substrate;
depositing a first layer of dielectric material over the first layer of amorphous CoFeB;
depositing a second layer of amorphous CoFeB over the first layer of dielectric material;
depositing an oxide layer over the second layer of amorphous CoFeB;
depositing a protective layer comprising at least Co and Fe on the oxide layer;
depositing a cladding layer on the protective layer, wherein the cladding layer is not less than 99% tungsten by weight; and
annealing the magnetic tunnel junction material stack to convert the first and second layers of amorphous CoFeB to polycrystalline CoFeB.

17. The method of claim 16, wherein depositing the cladding layer comprises depositing the cladding layer to a thickness of not less than 0.5 nm and not more than 5 nm.

18. The method of claim 16, wherein depositing the cladding layer comprises depositing the cladding layer to a thickness of not less than 2 nm and not more than 2.5 nm.

19. The method of claim 16, wherein depositing the second layer of amorphous CoFeB comprises depositing the second layer of amorphous CoFeB on the first layer of dielectric material and depositing the oxide layer comprises depositing the oxide layer on the second layer of amorphous CoFeB.

20. The method of claim 16, further comprising, prior to said annealing:
depositing a metal coupling layer on the second layer of amorphous CoFeB; and
depositing a third layer of amorphous CoFeB on the metal coupling layer.

* * * * *